United States Patent
Tsai et al.

(10) Patent No.: US 10,267,958 B2
(45) Date of Patent: Apr. 23, 2019

(54) DISPLAY MODULE AND HEAD MOUNTED DISPLAY USING THE SAME

(71) Applicant: AU OPTRONICS CORP., Hsin-Chu (TW)

(72) Inventors: Shang-Ta Tsai, Hsin-Chu (TW); Yu-Ching Wang, Hsin-Chu (TW); Ching-Yan Chao, Hsin-Chu (TW); Li-Wei Shih, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/410,164

(22) Filed: Jan. 19, 2017

(65) Prior Publication Data

US 2017/0212283 A1 Jul. 27, 2017

(30) Foreign Application Priority Data

Jan. 21, 2016 (TW) .............................. 105101897 A (51) Int. Cl.
*G02B 5/02* (2006.01)
*G02B 25/00* (2006.01)
(Continued)

(52) U.S. Cl.
CPC ......... *G02B 5/0242* (2013.01); *G02B 25/002* (2013.01); *G06F 1/163* (2013.01);
(Continued)

(58) Field of Classification Search
CPC . G02B 1/10; G02B 1/105; G02B 1/11; G02B 1/111; G02B 1/113; G02B 1/115;
(Continued)

(56) References Cited

U.S. PATENT DOCUMENTS 6,545,778 B2    4/2003 Ono et al.
2005/0207137 A1*  9/2005 Nishikawa ............. G06F 3/041
                                                        362/84
(Continued)

FOREIGN PATENT DOCUMENTS

CN            203652344        6/2014

*Primary Examiner* — Thong Q Nguyen
(74) *Attorney, Agent, or Firm* — WPAT, PC (57) ABSTRACT

A display module includes a bottom substrate, a display device having a plurality of display pixels, and a diffusion module. The display pixels are disposed between the bottom substrate and the diffusion module. The diffusion module has a thickness and a haze, wherein the haze of the diffusion module satisfies:

$A < \text{Haze} < B$; wherein $$A = 0.642 \times \frac{(NP)^{0.35}}{(NT)^{0.32}};$$

$$B = 0.821 \times \frac{(NP)^{0.45}}{(NT)^{0.60}};$$

$$NP = \frac{25400/PPI}{63\,\mu m};\text{ and}$$

$$NT = \frac{T}{500\,\mu m};$$

wherein PPI is a resolution of the display module, T is the thickness of the diffusion module, and Haze is the haze of the diffusion module.

11 Claims, 10 Drawing Sheets

(51) Int. Cl.
*G06F 1/16* (2006.01)
*H01L 27/32* (2006.01)
*H01L 51/52* (2006.01)

(52) U.S. Cl.
CPC ...... *H01L 27/3248* (2013.01); *H01L 51/5262* (2013.01); *H01L 51/5268* (2013.01); *H01L 2251/558* (2013.01)

(58) Field of Classification Search
CPC . G02B 5/00; G02B 5/003; G02B 5/02; G02B 5/0215; G02B 5/0221; G02B 5/0226; G02B 5/0231; G02B 5/0236; G02B 5/0242; G02B 5/0273; G02B 5/0278; G02B 5/0294; G02B 25/002; H01L 27/3248; H01L 51/5262; H01L 51/5268
See application file for complete search history.

(56) References Cited

U.S. PATENT DOCUMENTS

| | | |
|---|---|---|
| 2006/0279679 A1* | 12/2006 | Fujisawa .............. G02B 5/0221 349/116 |
| 2009/0147186 A1 | 6/2009 | Nakai et al. |
| 2010/0284071 A1 | 11/2010 | Kodama et al. |
| 2011/0261268 A1 | 10/2011 | Nakai et al. |
| 2012/0069273 A1* | 3/2012 | Watanabe ............ G02B 5/0215 349/64 |
| 2013/0249848 A1 | 9/2013 | Borrelli et al. |

\* cited by examiner

DISPLAY MODULE AND HEAD MOUNTED DISPLAY USING THE SAME

RELATED APPLICATIONS

This application claims priority to Taiwan Application Serial Number 105101897, filed Jan. 21, 2016, which is herein incorporated by reference.

BACKGROUND

Field of Disclosure

The present disclosure relates to a display module. More particularly, the present disclosure relates to a head mounted display applied to virtual reality technology.

Description of Related Art

Virtual Reality (VR) is a technology that generates virtual images and provides a virtual space by using computer technologies. With virtual reality glasses, a display device can be disposed adjacent to a user to project images to the user within a short distance. The display device provides the virtual images to the user with an optical design, such that the user can have a virtual experience. The user can also experience senses of sound and touch in cooperation with other devices. The virtual reality, which combines technologies such as computer technology, artificial intelligence, display, and processes, is a high-tech simulation system.

SUMMARY

An aspect of the present disclosure provides a display module including a bottom substrate, a display device having a plurality of display pixels, and a diffusion module. The display device is disposed between the bottom substrate and the diffusion module. The diffusion module has a thickness and a haze, wherein the haze of the diffusion module satisfies:

$$A < \text{Haze} < B; \text{ wherein}$$
$$A = 0.642 \times \frac{(NP)^{0.35}}{(NT)^{0.32}};$$
$$B = 0.821 \times \frac{(NP)^{0.45}}{(NT)^{0.60}};$$
$$NP = \frac{25400/PPI}{63\,\mu m}; \text{ and}$$
$$NT = \frac{T}{500\,\mu m};$$

wherein PPI is a resolution of the display module, T is the thickness of the diffusion module, and Haze is the haze of the diffusion module.

In one or more embodiments, the diffusion module comprises a diffusion plate including a diffusion layer and a base. The base is disposed between the diffusion layer and the bottom substrate.

In one or more embodiments, the diffusion module further includes a supporting element disposed between the diffusion plate and the bottom substrate.

In one or more embodiments, the diffusion layer of the diffusion plate includes a coating layer and a plurality of microstructures. The coating layer is disposed on the base. The microstructures are distributed in the coating layer.

In one or more embodiments, diameters of the microstructures are about 2 µm to about 20 µm.

In one or more embodiments, a thickness of the diffusion layer is about 8 µm to about 20 µm.

In one or more embodiments, each of the display pixels includes an active element and a light emitting device electrically connected to the active element.

In one or more embodiments, the light emitting devices of the display pixels are organic light emitting diodes.

In one or more embodiments, $0.6 \leq NP \leq 1.46$.

In one or more embodiments, $0.4 \leq NT \leq 2.6$.

Another aspect of the present disclosure provides a head mounted display including the aforementioned display module and at least one magnifying element. The diffusion module of the display module is disposed between the magnifying element and the bottom substrate of the display module.

In one or more embodiments, a magnification factor of the magnifying element is about 2.

In one or more embodiments, a distance between the magnifying element and the display module is about 0.5 cm to about 3 cm.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts. Further, the term "connect" or "electrically connected," as used herein, refers to the direct or indirect physical or electrical contact between or among two or more components, or the mutual operation or action of two or more components.

Figure 1:
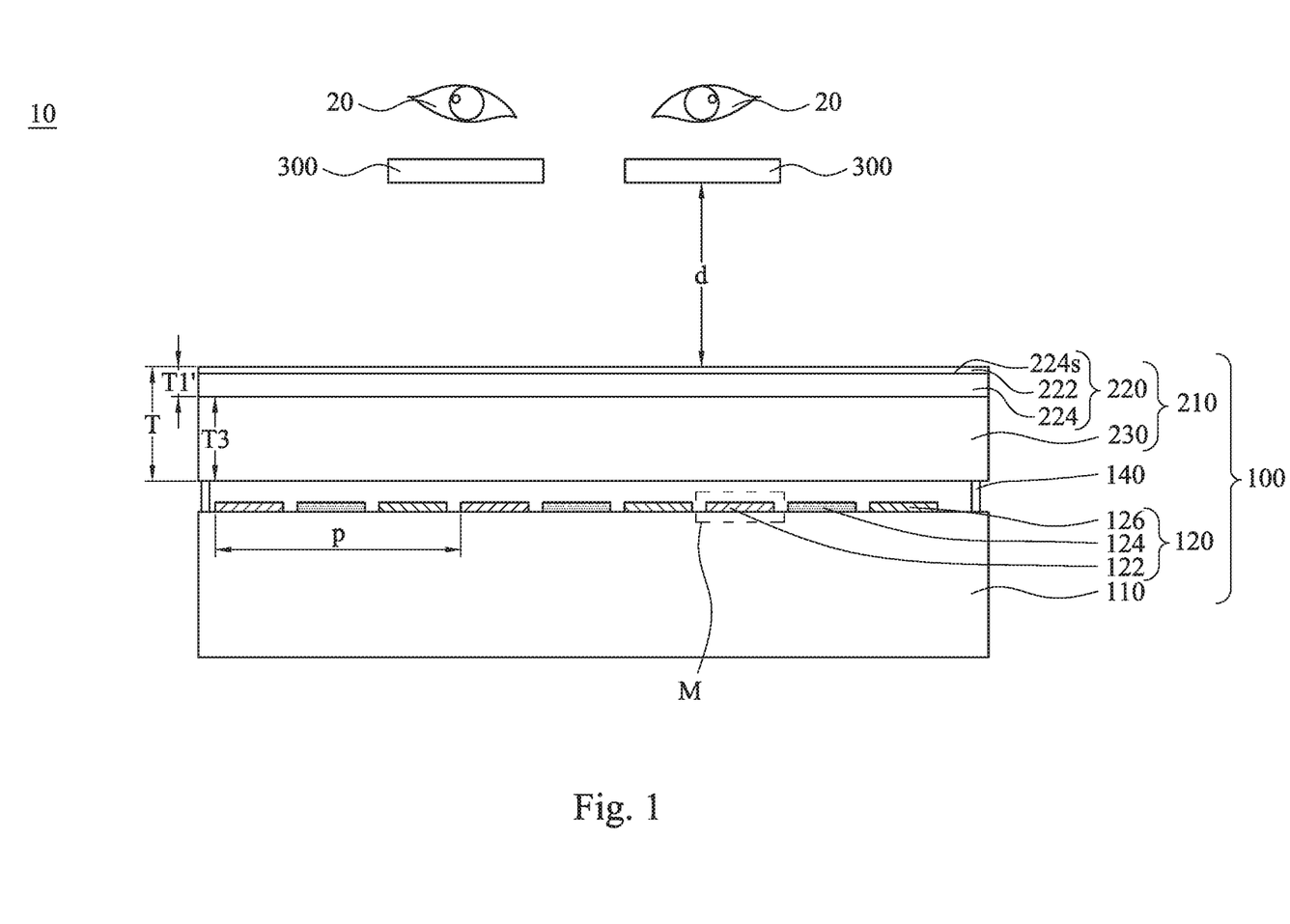
FIG. 1 is a schematic diagram of a head mounted display and eyes of an observer according to one embodiment of the present disclosure.

FIG. 1 is a schematic diagram of a head mounted display 10 and eyes 20 of an observer according to one embodiment of the present disclosure. The head mounted display 10 includes a display module 100 and at least one magnifying element 300. For example, in FIG. 1, the head mounted display 10 includes two magnifying elements 300, which respectively correspond to the left- and right-eyes 20 of the observer. The display module 100 includes a bottom substrate 110, a display device 120 having a plurality of display pixels, and a diffusion module 210. The display module 100 has a resolution. The display device 120 is disposed between the bottom substrate 110 and the diffusion module 210. The diffusion module 210 has a thickness T and a haze, and the haze of the diffusion module 210 satisfies:

$$A < \text{Haze} < B; \text{ wherein}$$
$$A = 0.642 \times \frac{(NP)^{0.35}}{(NT)^{0.32}};$$
$$B = 0.821 \times \frac{(NP)^{0.45}}{(NT)^{0.60}};$$
$$NP = \frac{25400/PPI}{63\,\mu m}; \text{ and}$$
$$NT = \frac{T}{500\,\mu m};$$

wherein Haze is the haze of the diffusion module 210, PPI is a resolution of the display module 100, NP is a pitch (the unit is μm, and the pitch is calculated from the resolution of the display module 100) of the display pixels of the display device 120 divided by 63 μm, and NT is the thickness T (unit is μm) of the diffusion module 210 divided by 500 μm. In the present embodiment, the haze was measured in accordance with Japanese Industrial Standards (JIS) K7105. That is, the haze is a ratio of an amount of the transmission light having an angle greater than 2.5 degrees (relative to the normal line of a measured surface 224s of the diffusion module 210) to the total amount of the transmission light.

The head mounted display 10 of the present embodiment provides good display quality by adjusting the relationship between the resolution of the display module 100, the thickness T of the diffusion module 210, and the haze of the diffusion module 210. More specifically, the observer can watch images displayed by the display module 100 through the magnifying elements 300 when he or she wears the head mounted display 10. However, since the magnifying elements 300 magnify the displayed images, the observer may experience pixelized images if the resolution is low. The pixelized images can be improved by adjusting the haze of the diffusion module 210, which is disposed on the bottom substrate 110 and the display device 120 (i.e., disposed between the magnifying elements 300 and the bottom substrate 110). The diffusion module 210 can diffuse the displayed image of the display device 120, such that the pixelized images can be improved. However, the image may be over diffused when the haze and/or the thickness T of the diffusion module 210 is increased, presenting the observer with an experience of diffuseness image. Therefore, the display module 100 of the present embodiment can balance the sense of grain and sense of blur by satisfying the aforementioned formulas to provide good display quality.

In the present embodiment, the diffusion module 210 includes a diffusion plate 220 and a supporting element 230 disposed between the diffusion plate 220 and the bottom substrate 110. The supporting element 230 may be a glass substrate or a plastic substrate, and the bottom substrate 110 may be a glass substrate or a plastic substrate. The diffusion plate 220 includes a diffusion layer 222 and a base 224. The haze of the diffusion module 210 mainly depends on the design of the diffusion layer 222. The base 224 is disposed between the diffusion layer 222 and the supporting element 230, and the base 224 has the surface 224s.

Figure 2:
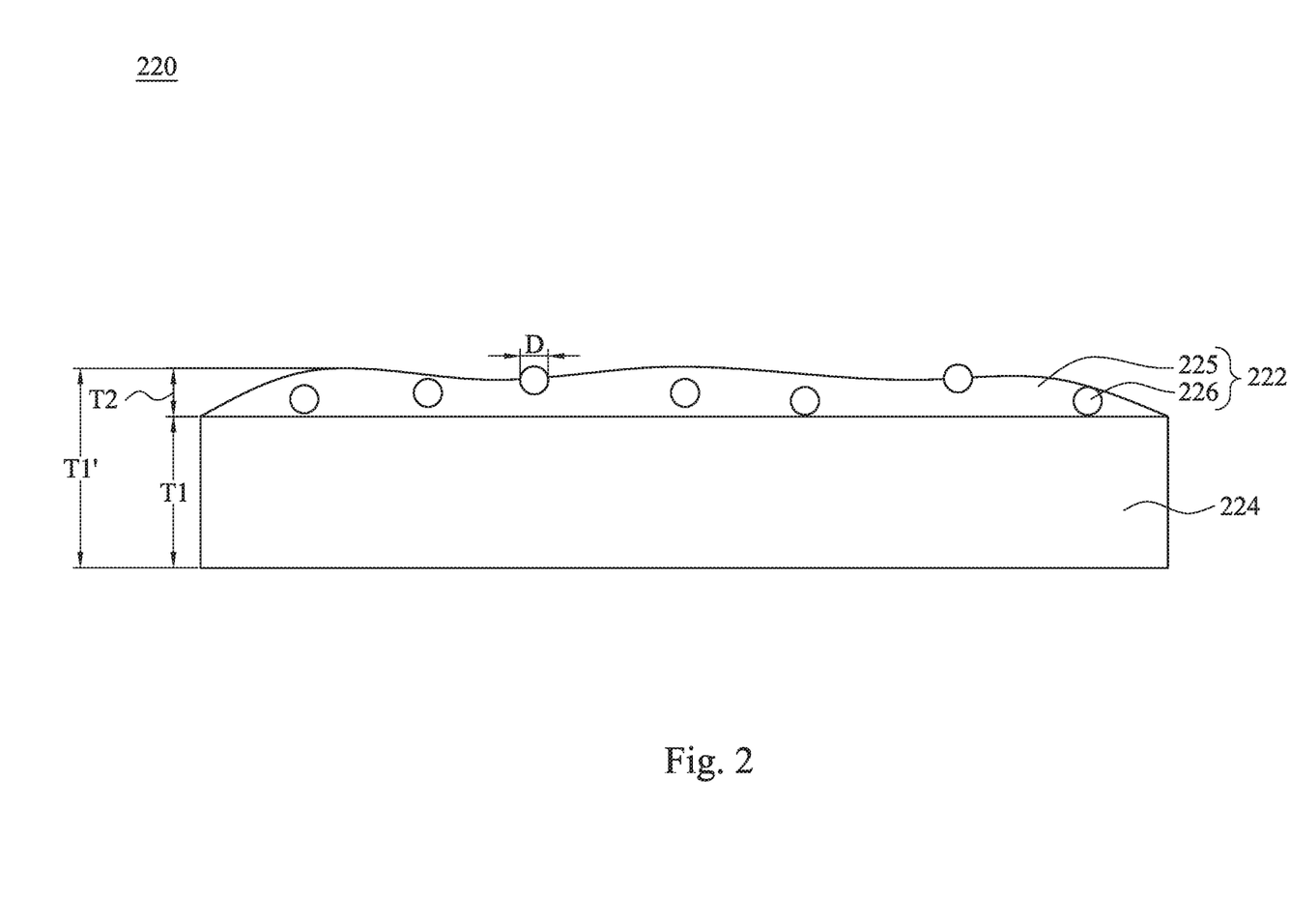
FIG. 2 is a schematic diagram of the diffusion plate of FIG. 1.

FIG. 2 is a schematic diagram of the diffusion plate 220 of FIG. 1. The diffusion layer 222 of the diffusion plate 220 includes a coating layer 225 and a plurality of microstructures 226. The coating layer 225 is disposed on the base 224, and the microstructures 226 are distributed in the coating layer 225. The microstructures 226 can be micro-sized particles, which have diameters of about 2 μm to about 20 μm. These microstructures 226 may have substantially the same diameters D as shown in FIG. 2, or the microstructures 226 may have different diameters D. An embodiment falls within the claimed scope as long as the diameters D of the microstructures 226 are in the range of about 2 μm to about 20 μm. The microstructures 226 may be made of organic material or other suitable materials. The microstructures 226 can be particles with regular or irregular profiles.

The coating layer 225 can be a transparent material, and the coating layer 225 is configured to fix the microstructures 226 onto the base 224. The haze of the diffusion layer 222 can be changed by adjusting the density of the microstructures 226 in the coating layer 225 (or the distribution density of the microstructures 226 on the surface 224s of the base 224), the sizes of the microstructures 226, the surface undulation of the diffusion layer 222, or the materials of the diffusion layer 222. For example, the haze of the diffusion layer 222 increases when the density of the microstructures 226 increases, and vice versa. The microstructures 226 can be randomly distributed in the coating layer 225. That is, the distances among the microstructures 226 can be different, and can be arranged non-periodically. Moreover, the base 224 can be made of low haze and transparent materials, such as plastic (for example, Polyethylene terephthalate (PET), Polycarbonates (PC), Triacetate Cellulose (TAC)), adhesive, glass, or stacks of layers thereof, and the claimed scope is not limited in this respect.

In some embodiments, the thickness T1 of the base 224 can be about 50 μm to about 100 μm, and the thickness T2 of the diffusion layer 222 can be about 8 μm to about 20 μm, and the claimed scope is not limited in this respect. In some embodiments, the thickness T1 of the base 224 is much greater than the thickness T2 of the diffusion layer 222, such that the thickness T2 of the diffusion layer 222 can be omitted in the calculation of the thickness T1' of the diffusion plate 220. That is, the thickness T1 of the base 224 is substantially equal to the thickness T1' of the diffusion plate 220.

Reference is made to FIG. 1. The supporting element 230 is disposed between the diffusion plate 220 and the bottom substrate 110. The supporting element 230 is configured to increase the thickness T of the diffusion module 210, making the diffusion module 210 have a desired thickness. In some embodiments, the supporting element 230 can be a low haze and transparent material, such as glass or plastic, and the claimed scope is not limited in this respect. Since the supporting element 230 and the base 224 of the diffusion plate 220 are transparent materials, the transmission of the diffusion module 210 is substantially not reduced. The supporting element 230 has a thickness T3. The thickness T of the diffusion module 210, which is a sum of the thickness T3 of the supporting element 230 and the thickness T1' of the diffusion plate 220, can be adjusted by adjusting the thickness T3. In some other embodiments, a plurality of the supporting elements 230 can be added to increase the thickness T of the diffusion module 210.

Figure 3:
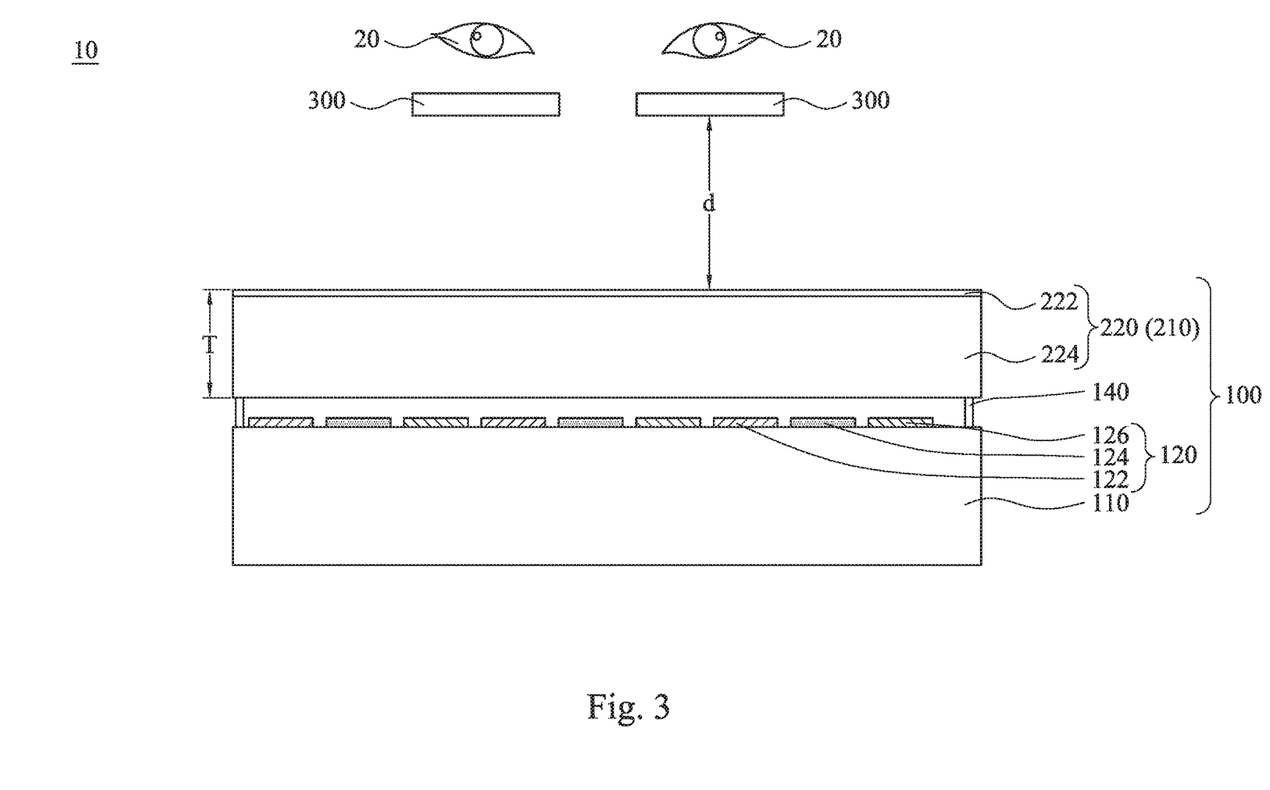
FIG. 3 is a schematic diagram of a head mounted display and eyes of an observer according to another embodiment of the present disclosure.

However, the configuration of the diffusion module 210 is not limited to FIG. 1. FIG. 3 is a schematic diagram of a head mounted display 10 and eyes 20 of an observer according to another embodiment of the present disclosure. The difference between FIGS. 3 and 1 pertains to the configuration of the diffusion module 210. In FIG. 3, the diffusion module 210 includes the diffusion plate 220. Whereas the base 224 and the supporting element 230 of FIG. 1 are integrally formed. Hence, the thickness of the diffusion plate 220 is the thickness T of the diffusion module 210. Basically, whether the thickness of the base 224 is adjusted, or the supporting element 230 is added beneath the diffusion plate 220 to thicken the diffusion module 210, an embodiment falls within the claimed scope as long as the thickness T of the diffusion module 210 can be adjusted. Other relevant details of FIG. 3 are similar to FIG. 1, and, therefore, a description in this regard will not be repeated hereinafter.

Figure 4:
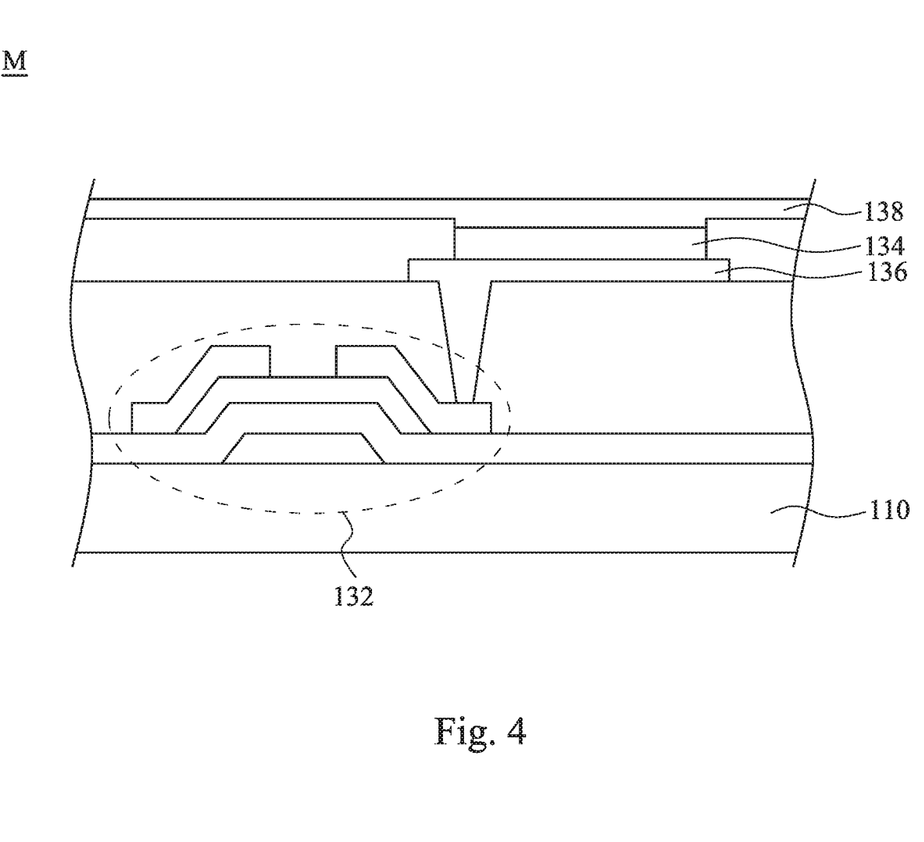
FIG. 4 is an enlarged diagram of area M of FIG. 1.

FIG. 4 is an enlarged diagram of area M of FIG. 1. Reference is made to FIGS. 1 and 4. In the present embodiment, a display sub-pixel 122 includes an active element 132 and a light emitting device. The active element 132 can be a transistor, which is electrically connected to the light emitting device to control the light emitting of the display sub-pixel 122. The light emitting device can be a light emitting diode, such as an organic light emitting diode, and the claimed scope is not limited in this respect. The display panel made of an organic light emitting diode is self-luminous and has properties like high contrast, low power consumption, fast response time, and high color saturation, being able to provide good display images. In FIG. 4, the light emitting device includes a bottom electrode 136, a light emitting material 134, and a top electrode 138. The bottom electrode 136 is electrically connected to the active element 132, and the light emitting material 134 is disposed between the bottom electrode 136 and the top electrode 138. In some embodiments, the display device 120 has a plurality of sub-pixels including red sub-pixels 122, green sub-pixels 124, and blue sub-pixels 126. The red sub-pixels 122, the green sub-pixels 124, and the blue sub-pixels 126 are disposed between the bottom substrate 110 and the diffusion module 210. The display module 100 can further includes a sealing 140 surrounding the display device 120 and connected to the bottom substrate 110 and the supporting element 230 as shown in FIG. 1, or connected to the bottom substrate 110 and the base 224 of the diffusion plate 220 as shown in FIG. 3. As such, the supporting element 230 as shown in FIG. 1 or the base 224 as shown in FIG. 3 can be a packaging cover to protect the display device 120, and the claimed scope is not limited in this respect. In some embodiments, the display device 120 can be thin-film encapsulated, which is an encapsulation process using organic or inorganic material stacking above the light emitting device to protect the display device 120. In some embodiments, the display device 120 can be white organic light emitting diodes with color filters to form the red sub-pixels 122, the green sub-pixels 124, and the blue sub-pixels 126. In some other embodiments, the red sub-pixels 122, the green sub-pixels 124, and the blue sub-pixels 126 can individually be red, green, and blue light emitting materials, such as organic light emitting materials, to respectively emit red, green, and blue lights. Although there are only three types of sub-pixels, i.e., the red sub-pixels 122, the green sub-pixels 124, and the blue sub-pixels 126 in FIG. 1, other color sub-pixels can be added into the display device 120 to increase the color saturation of the display frames in some other embodiments.

In FIG. 1, the red sub-pixels 122, the green sub-pixels 124, and the blue sub-pixels 126 are alternately arranged along a fixed direction. The red sub-pixel 122, the green sub-pixel 124, and the blue sub-pixel 126 form a pixel, and each pixel has a pitch p. The resolution (PPI, pixel per inch, i.e., the amount of the pixels in per inch) of the display module 100 can be calculated from the pitch p. The resolution is 25400/p if the unit of the pitch is micrometer.

Figure 5:
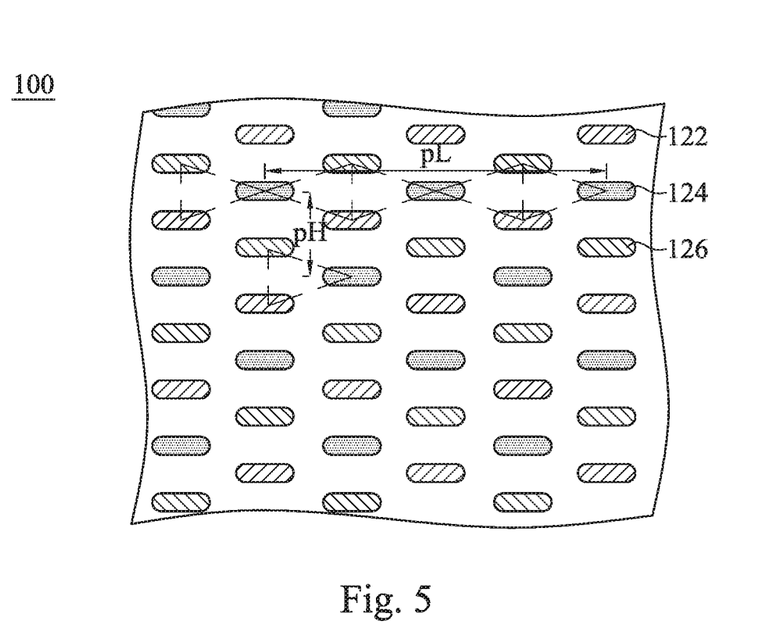
FIGS. 5-7 are top views of the display module of FIG. 1 according to different embodiments.
Figure 6:
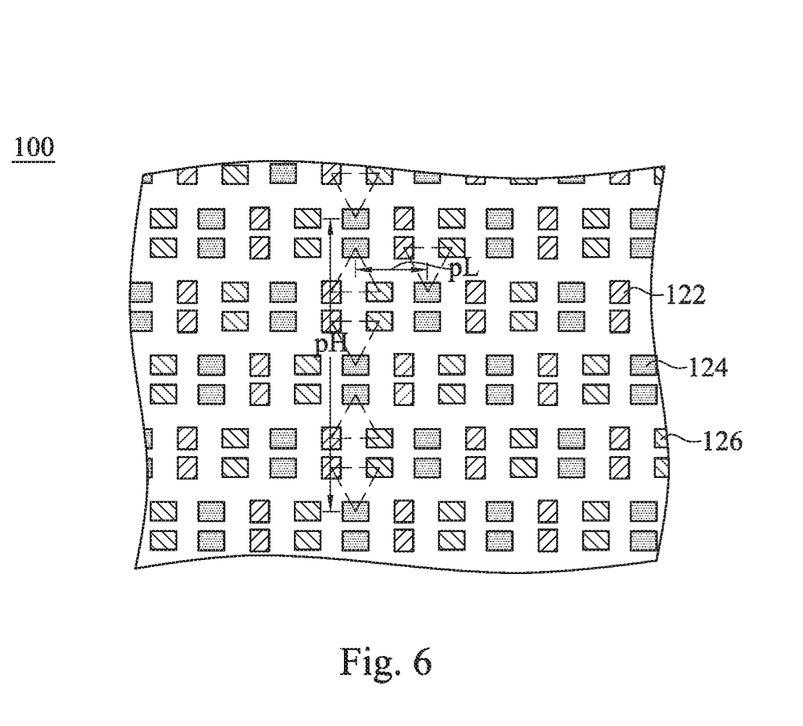
Figure 7:
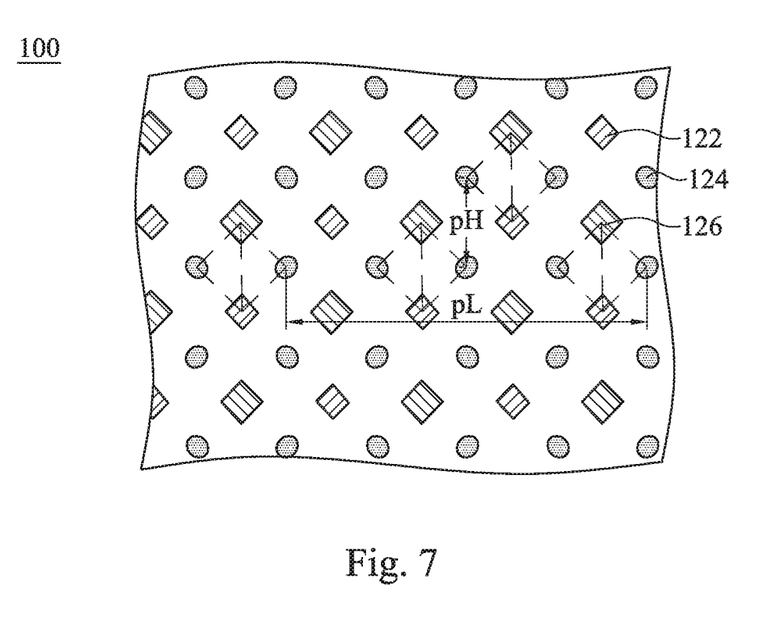

However, the arrangement manner of the sub-pixels is not limited in FIG. 1. FIGS. 5-7 are top views of the display module 100 of FIG. 1 according to different embodiments. In FIGS. 5-7, the centers of three sub-pixels of one of the pixels are connected by dashed lines. As shown in FIGS. 5-7, the sub-pixels of each pixel are arranged to form a triangle. In FIG. 5, two adjacent pixels share a red sub-pixel 122, a green sub-pixel 124, or a blue pixel 126. Such configuration can achieve high-resolution frames with fewer amounts of the sub-pixels. The pitch p of the pixels along a vertical direction is the distance pH (about 63 μm), and the pitch p of the pixels along a lateral direction is the distance pL/4 (about 63 μm). That is, in FIG. 5, the resolution of the display module 100 is about 25400/63=403, i.e., there are about 403 pixels per inch. In FIG. 6, the pitch p of the pixels along a vertical direction is the distance pH/4 (about 92 μm), and the pitch p of the pixels along a lateral direction is the distance pL (about 92 μm). That is, in FIG. 6, the resolution of the display module 100 is about 25400/92=276, i.e., there are about 276 pixels per inch. Moreover, in FIG. 7, two adjacent pixels share a red sub-pixel 122 and a blue pixel 126. Such configuration can achieve high-resolution frames with fewer amounts of the sub-pixels. The pitch p of the pixels along a vertical direction is the distance pH (about 39 μm), and the pitch p of the pixels along a lateral direction is the distance pL/4 (about 39 μm). That is, in FIG. 7, the resolution of the display module 100 is about 25400/39=652, i.e., there are about 652 pixels per inch.

The aforementioned arrangements of the sub-pixels are illustrative only, and should not limit the claimed scope. A person having ordinary skill in the art may select a suitable arrangement for the sub-pixels according to actual requirements. Basically, the display module 100 has a pitch (a+b)/2 if the display module 100 has a pitch a along the lateral direction and a pitch b along the horizontal direction. Moreover, the resolution in FIG. 6 is referred to as a real resolution since the display module 100 in FIG. 6 has no shared sub-pixels. The resolutions in FIGS. 5 and 7 are referred to as virtual resolutions since the red sub-pixels 122, the green sub-pixels 124, and the blue sub-pixels 126 in FIG. 5 and the red sub-pixels 122 and the blue sub-pixels 126 in FIG. 7 are shared sub-pixels. Furthermore, the diffusion module 210 does not affect the resolution of the display module 100. The diffusion module 210 can be omitted or only the base 224 or the supporting element 230 of the diffusion module 210 is added in the resolution calculation.

Reference is made to FIG. 1. In the present embodiment, the magnifying element 300 can be a lens, such as a combination of a convex lens(es) or a concave lens(es). The magnification factor of the magnifying element 300 can be about 2. That is, the magnifying element 300 can magnify the display frames of the display module 100 about twice. Moreover, a distance d between the magnifying element 300 and the display module 100 is about 0.5 cm to about 3 cm, and the claimed scope of the present disclosure is not limited in the aforementioned magnification factor and the distance d.

Figure 8:
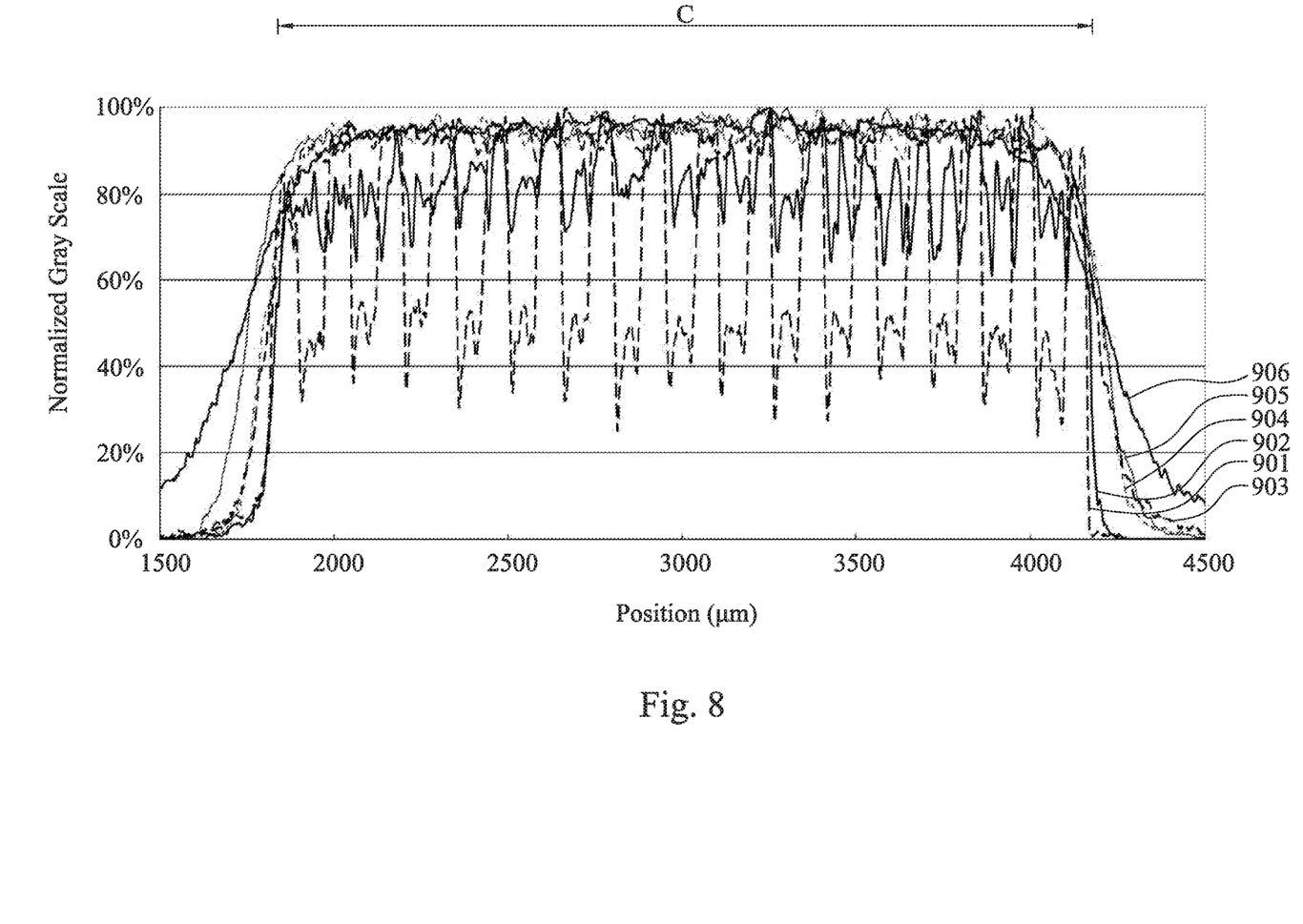
FIG. 8 is a graph of normalized gray scale vs. position of the display module according to one example of the present disclosure.

To obtain the balance between the sense of grain and the sense of blur of the frames, the present disclosure provides an analysis method of the intensity distribution of the frames to obtain the relationship of the sense of grain and the sense of blur of the frames with respect to the haze of the diffusion module. FIG. 8 is a graph of normalized gray scale vs. position of the display module according to one example of the present disclosure. FIG. 8 was obtained by measuring the intensity distribution of a line, which was displayed by the display module, along the positions. The normalized gray scale along vertical axis was the values normalized from the measured intensity distribution. The line was located about in the area C of FIG. 8, i.e., about 1800 μm to about 4200 μm. The definition of the sense of grain is the standard deviation of the normalized gray scale of the line, the definition of a diffusion distance is the distance of the normalized gray scale from about 80% to about 20% at the edges of the line, and the definition of the sense of blur is the diffusion distance divided by NP. In this example, NP=1 and NT=1. Moreover, the curve 901 represents the normalized gray scale distribution when the haze was about 0%, the curve 902 represents the normalized gray scale distribution when the haze was about 46%, the curve 903 represents the normalized gray scale distribution when the haze was about 67%, the curve 904 represents the normalized gray scale distribution when the haze was about 74%, the curve 905 represents the normalized gray scale distribution when the haze was about 84%, and the curve 906 represents the normalized gray scale distribution when the haze was about 92%. As shown in FIG. 8, when the haze was decreased, along the position axis, the variation of the normalized gray scale was increased, the standard deviation of the normalized gray scale was high, and the sense of grain was significant. When the haze was increased, along the position axis, the variation of the normalized gray scale was decreased, the standard deviation of the normalized gray scale was low, and the sense of grain was insignificant. Moreover, when the haze was decreased, the diffusion distance was short and the sense of blur was low. When the haze was increased, the diffusion distance was long and the sense of blur was high.

Figure 9:
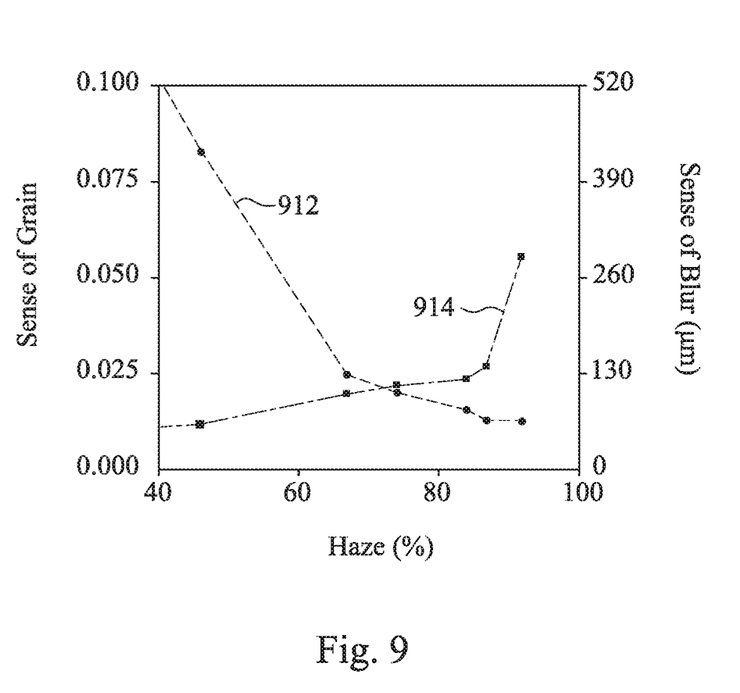
FIGS. 9 and 10 are graphs of the sense of grain and the sense of blur of the display module vs. the haze of the diffusion module according to two examples of the present disclosure.
Figure 10:
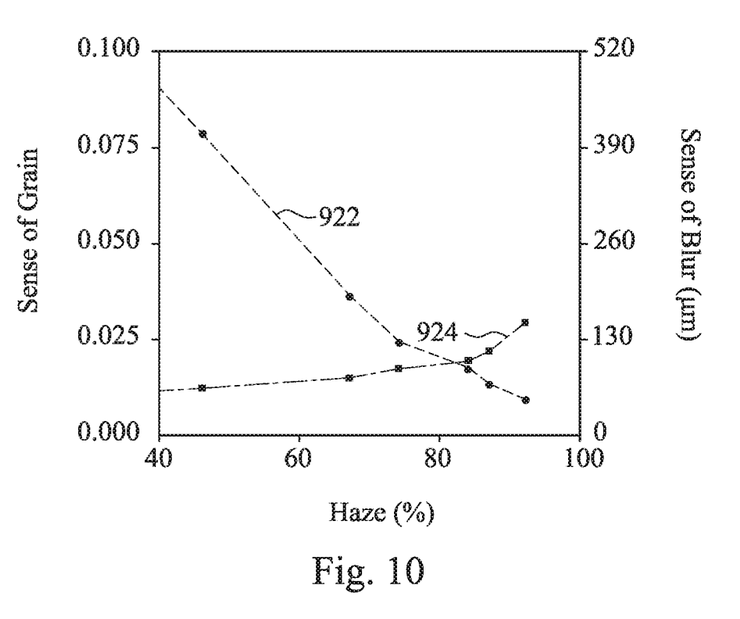

FIGS. 9 and 10 are graphs of the sense of grain and the sense of blur of the display module 100 vs. the haze of the diffusion module 210 according to two examples of the present disclosure. In these two examples, the thicknesses of the diffusion module 210 were about 500 μm, i.e., NT=1. The measurement method and the definitions of the terms were the same as FIG. 8.

In the example of FIG. 9, the pitch p of the display module was about 63 μm, i.e., NP=1. The curve 912 represented the sense of grain and the curve 914 represented the sense of blur. Table 1 is values of the sense of grain, the sense of blur, and the haze of FIG. 9.

TABLE 1

| Sample | Haze (%) | Sense of Grain | Diffusion Distance (μm) | Sense of Blur (μm) |
|---|---|---|---|---|
| 1 | 0 | 0.2300 | 38.6 | 39 |
| 2 | 46 | 0.0827 | 60.7 | 61 |
| 3 | 67 | 0.0248 | 102.1 | 102 |
| 4 | 74 | 0.0201 | 114.1 | 114 |
| 5 | 84 | 0.0155 | 121.6 | 122 |
| 6 | 87 | 0.0129 | 138.3 | 138 |
| 7 | 92 | 0.0125 | 286.1 | 286 |

The results of human factors experiments showed that observers experienced balance feelings between the sense of grain and the sense of blur when the haze was 67%~84%. The human factors experiments were experiments that provided the samples to the observers, and the observers then visually analyzed the sense of grain and the sense of blur of the 7 samples.

Moreover, in FIG. 10, the pitch p of the display module was about 92 μm, i.e., NP=1.46. The curve 922 represented the sense of grain, and the curve 924 represented the sense of blur. Table 2 is values of the sense of grain, the sense of blur, and the haze of FIG. 10.

TABLE 2

| Sample | Haze (%) | Sense of Grain | Diffusion Distance (μm) | Sense of Blur (μm) |
|---|---|---|---|---|
| 1 | 0 | 0.1661 | 49.3 | 34 |
| 2 | 46 | 0.0783 | 90.5 | 62 |
| 3 | 67 | 0.0362 | 113.0 | 77 |
| 4 | 74 | 0.0242 | 129.9 | 89 |
| 5 | 84 | 0.0176 | 145.9 | 100 |
| 6 | 87 | 0.0132 | 162.0 | 111 |
| 7 | 92 | 0.0094 | 221.6 | 152 |

The results of human factors experiments showed that observers experienced balance feelings between the sense of grain and the sense of blur when the haze was 74%~87%. The abovementioned two examples showed the display module has better display qualities when the sense of grain was less than about 0.025 and the sense of blur was less than about 130 μm. In one or more embodiments, $0.6 \leq NP \leq 1.46$, or $1 \leq NP \leq 1.46$.

Figure 11:
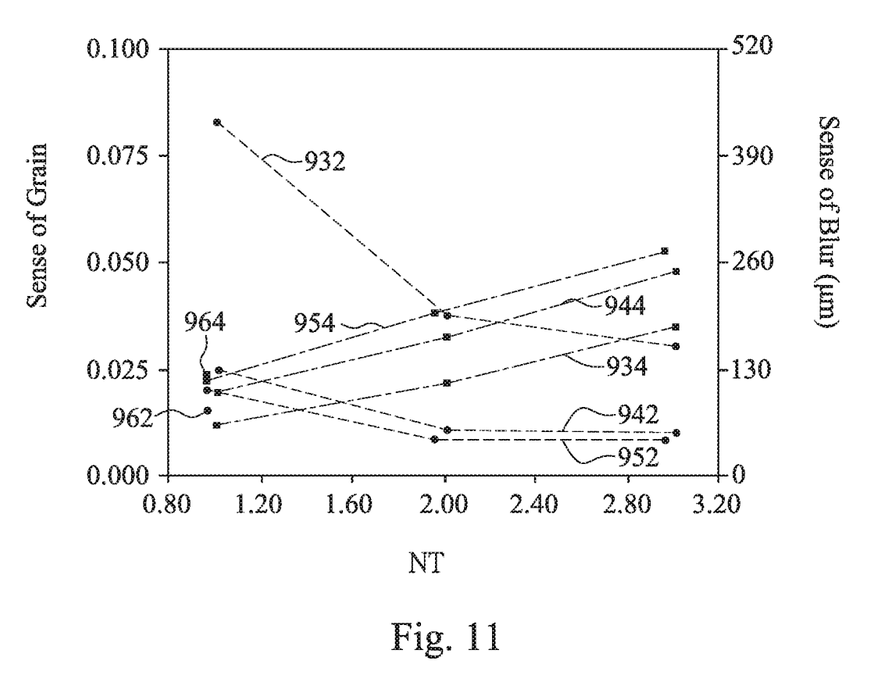
FIG. 11 is a graph of the sense of grain, the sense of blur, and the haze of the diffusion module with respect to the thickness of the diffusion module according to one example of the present disclosure.

FIG. 11 is a graph of the sense of grain, the sense of blur, and the haze of the diffusion module with respect to the thickness of the diffusion module according to one example of the present disclosure. The measurement method and the definitions of the terms were the same as FIG. 8. In FIG. 11, the pitch p of the display module was about 63 μm, i.e., NP=1. The curve 932 represented the sense of grain when the haze was 46%, the curve 934 represented the sense of blur when the haze was 46%, the curve 942 represented the sense of grain when the haze was 67%, the curve 944 represented the sense of blur when the haze was 67%, the curve 952 represented the sense of grain when the haze was 74%, the curve 954 represented the sense of blur when the haze was 74%, the curve 962 represented the sense of grain when the haze was 84%, and the curve 964 represented the sense of blur when the haze was 84%. Table 3 is values of the sense of grain, the sense of blur, the haze, and the thickness of the diffusion module of FIG. 10.

TABLE 3

| Sample | Haze (%) | NT | Sense of Grain | Diffusion Distance (μm) | Sense of Blur (μm) |
|---|---|---|---|---|---|
| 1 | 84 | 0.97 | 0.0155 | 121.6 | 122 |
| 2 | 74 | 0.97 | 0.0201 | 114.1 | 114 |
| 3 | 74 | 1.97 | 0.0085 | 197.6 | 198 |
| 4 | 74 | 2.97 | 0.0086 | 271.6 | 272 |
| 5 | 67 | 1.02 | 0.0248 | 102.1 | 102 |
| 6 | 67 | 2.02 | 0.0106 | 168.3 | 168 |
| 7 | 67 | 3.02 | 0.0099 | 246.9 | 247 |
| 8 | 46 | 1.01 | 0.0827 | 60.7 | 61 |
| 9 | 46 | 2.01 | 0.0376 | 113.0 | 113 |
| 10 | 46 | 3.01 | 0.0301 | 180.7 | 181 |

Figure 12:
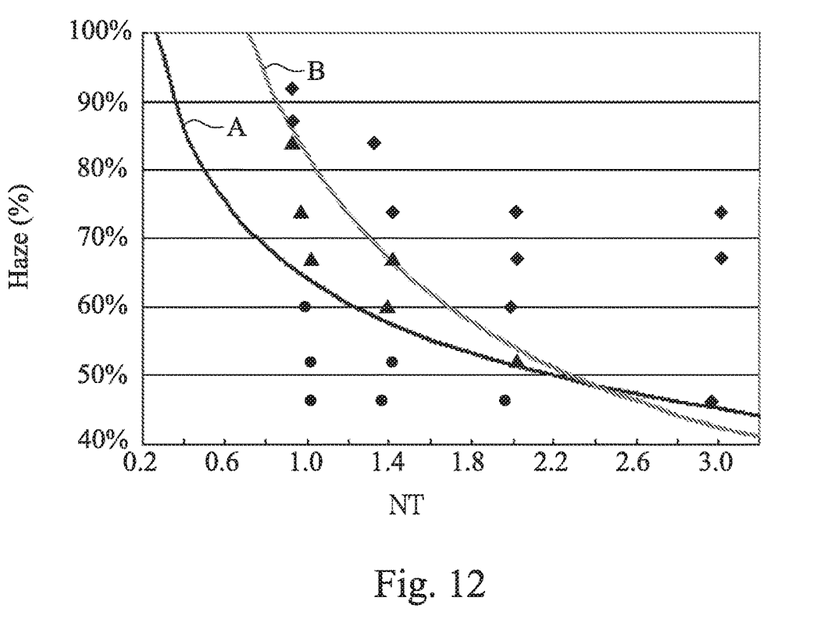
FIGS. 12 and 13 are graphs of the haze vs. the thickness of the diffusion module according to two examples of the present disclosure.
Figure 13:
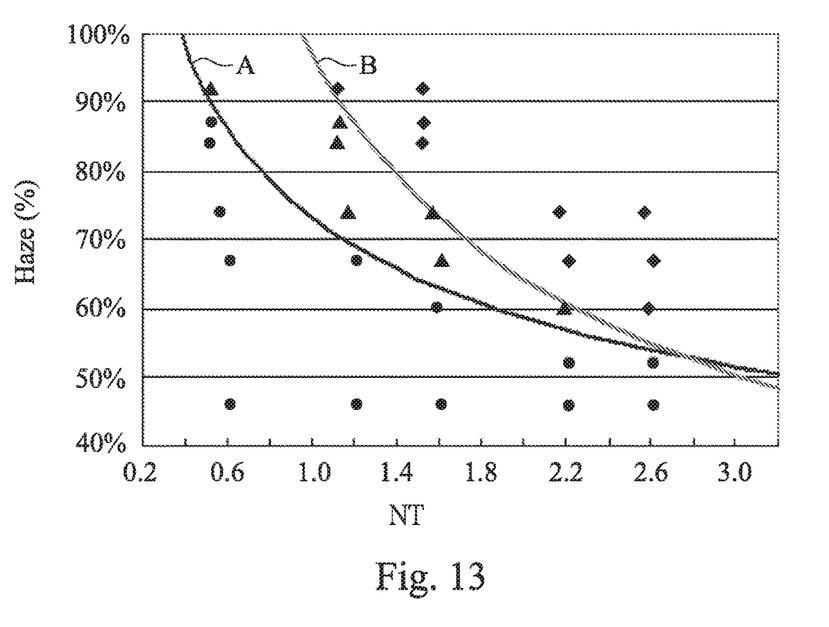

FIGS. 12 and 13 are graphs of the haze vs. the thickness of the diffusion module according to two examples of the present disclosure. In FIG. 12, the pitch p of the display module was about 63 μm, i.e., NP=1. In FIG. 13, the pitch p of the display module was about 92 μm, i.e., NP=1.46. In these two examples, the head mounted displays with different thicknesses and different hazes were proceeded human factors experiments and the obtained display qualities were made as FIGS. 12 and 13. In FIGS. 12 and 13, the triangle marks (▲) represented good display qualities, the circle marks (●) represented the display qualities with excessive sense of grain, and the diamond marks (◆) represented the display qualities with excessive sense of blur. Curves A and B were obtained from these data (or marks). The curve A was an interface between the triangle marks and the circle marks with the formula:

$$A = 0.642 \times \frac{(NP)^{0.35}}{(NT)^{0.32}};$$

and the curve B was an interface between the triangle marks and the diamond marks with the formula:

$$B = 0.821 \times \frac{(NP)^{0.45}}{(NT)^{0.60}};$$

and good display qualities could be obtained when A<Haze<B, where B was smaller than or equal to 100%. Moreover, FIGS. 12 and 13 also showed that the good display qualities were located in the range of 0.4≤NT≤2.6, and the claimed scope of the present disclosure is not limited in this respect.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A display module comprising:
   a substrate;
   a display device having a plurality of display pixels; and
   a diffusion module, the display device disposed between the substrate and the diffusion module, and the diffusion module having a thickness and a haze, wherein the haze of the diffusion module satisfies:

$$A < \text{Haze} < B; \text{ wherein}$$

$$A = 0.642 \times \frac{(NP)^{0.35}}{(NT)^{0.32}};$$

$$B = 0.821 \times \frac{(NP)^{0.45}}{(NT)^{0.60}};$$

$$NP = \frac{25400/PPI}{63\,\mu m}; \text{ and}$$

$$NT = \frac{T}{500\,\mu m};$$

wherein PPI is a resolution of the display module, T is the thickness of the diffusion module, and Haze is the haze of the diffusion module, wherein 0.6≤NP≤1.46, wherein 0.4≤NT≤2.6.

2. The display module of claim 1, wherein the diffusion module comprises:
   a diffusion layer; and
   a base located between the diffusion layer and the display device.

3. The display module of claim 2, wherein the diffusion module further comprises a supporting element disposed between the base and the display device.

4. The display module of claim 2, wherein the diffusion layer comprises:
   a coating layer disposed on the base; and
   a plurality of microstructures distributed in the coating layer.

5. The display module of claim 4, wherein diameter of each of the microstructures is about 2 μm to about 20 μm.

6. The display module of claim 2, wherein a thickness of the diffusion layer is about 8 μm to about 20 μm.

7. The display module of claim 1, wherein each of the display pixels comprises:
   an active element; and
   a light emitting device electrically connected to the active element.

8. The display module of claim 7, wherein the light emitting devices of the display pixels are organic light emitting diodes.

9. A head mounted display comprising:
   the display module of claim 1; and
   at least one magnifying element, wherein the diffusion module of the display module is disposed between the magnifying element and the substrate of the display module.

10. The head mounted display of claim 9, wherein a magnification factor of the magnifying element is about 2.

11. The head mounted display of claim 9, wherein a distance between the magnifying element and the display module is about 0.5 cm to about 3 cm.

* * * * *